(12) United States Patent
Sohn et al.

(10) Patent No.: US 6,618,299 B2
(45) Date of Patent: Sep. 9, 2003

(54) SEMICONDUCTOR MEMORY DEVICE WITH REDUNDANCY

(75) Inventors: Kyo-Min Sohn, Seoul (KR); Young-Ho Suh, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/946,744

(22) Filed: Sep. 5, 2001

(65) Prior Publication Data

US 2002/0086449 A1 Jul. 4, 2002

(30) Foreign Application Priority Data

Jan. 4, 2001 (KR) .......................................... 2001-331

(51) Int. Cl.[7] ................................................ G11C 7/00
(52) U.S. Cl. ...................................... 365/200; 365/191
(58) Field of Search ................................. 365/200, 196, 365/230.02, 189.02, 230.03, 230.06, 231, 191

(56) References Cited

U.S. PATENT DOCUMENTS

| | | | | |
|---|---|---|---|---|
| 5,195,057 A | * | 3/1993 | Kasa et al. .................. 365/200 |
| 5,278,794 A | * | 1/1994 | Tanaka et al. ......... 365/185.17 |
| 5,422,850 A | * | 6/1995 | Sukegawa et al. ............. 326/13 |
| 5,652,725 A | * | 7/1997 | Suma et al. ................. 365/200 |
| 5,689,465 A | * | 11/1997 | Sukegawa et al. .......... 365/200 |
| 5,793,683 A | | 8/1998 | Evans |
| 6,115,300 A | * | 9/2000 | Massoumi et al. .......... 365/200 |
| 6,195,762 B1 | * | 2/2001 | Shore ......................... 714/711 |

* cited by examiner

*Primary Examiner*—Thong Le
(74) *Attorney, Agent, or Firm*—F. Chau & Associates, LLP

(57) ABSTRACT

A semiconductor memory device having redundancy with no performance penalty. The semiconductor memory device with redundancy includes a default array; a row redundant array block separated from the default array and provided with row redundant arrays for making up for a deficiency in a row direction; a column redundant array block separated from the default array and provided with column redundant arrays for making up for a deficiency in a column; a control block supplying a control signal commonly to the default array, row redundant array, and column redundant array; and a redundant calculation block for receiving address and control signals to generate a control signal necessary to the redundant array and to determine whether the redundant array is accessed, and to generate a signal to disable a sense amplifier of the default array during the redundant array access.

13 Claims, 7 Drawing Sheets

SEMICONDUCTOR MEMORY DEVICE WITH REDUNDANCY

BACKGROUND

1. Technical Field

The present invention relates generally to a semiconductor memory device and, more particularly, to a semiconductor memory device having a redundancy without a performance penalty.

2. Description of Related Art

A potential consequence of using a redundant cell array to repair a high-speed semiconductor memory device having a defect in a memory array is a decrease in the speed of operation, which can result in poor performance and operation of the semiconductor memory device. Various techniques have been developed to address performance penalties associated with repairing semiconductor chips.

One method for preventing performance loss as a result of repairing a semiconductor memory is disclosed in U.S. Pat. No. 5,793,683 (hereinafter, the '683 patent) entitled "Wordline and Bitline Redundancy With No Performance Penalty," issued on Aug. 11, 1998. FIG. 1 is a block diagram of a memory array with redundancy as disclosed in the '683 patent and FIG. 2 is a diagram of a redundancy circuit as disclosed in the '683 patent. Referring to FIG. 1, a separate default array 1 and redundant array 4 are provided. As explained in detail in the '683 patent, at the start of a given (read or write) cycle, an applied address is sent to both the normal array 1 and the redundancy calculation module 3. While accessing the normal array 1, the redundancy calculation 3 determines if the applied address matches any defective addressed stored in the fuse banks, and if so, accesses the redundant array 1.

Data read out of the arrays 1 and 4 are supplied to a multiplexer 5, which is controlled by selection signal ("redundancy active") output from the redundancy calculation module 3. By way of example, during a read cycle, if the redundancy calculation module 3 determines that the applied address corresponds to defective memory cells, the access is implemented in the redundant array 4 irrespective of the operation in the default array 1. If the redundant array 4 is accessed during a read, then the multiplexer 5 will selected the output of the redundant array, thereby implementing a redundancy operation. Accordingly, during read and write accesses, the redundancy calculation and redundant array access is performed in parallel with the normal array access. Thus, the performance is not degraded by the redundancy, if the redundancy calculation and redundant array access is not greater that the delay through the normal array.

Referring to FIG. 2, a diagram illustrates the structure of the redundant array 4 of FIG. 1 in greater detail. A plurality of redundant wordline blocks of cells $WLR_0-WLR_7$ and a plurality of redundant bitline blocks of cells $BLR_O-BLR_7$ are mapped into the array 4 as blocks of cells. The redundant array 4 allows a row repair WL at an upper portion thereof and a column repair BL thereof. Wordline decoders 6 decode the word addresses and bitline decoders 8 decode the bit addresses. A selector 7, which is controlled by the redundancy calculation module 3, supplies these addresses. Thus, the bit line decoding in the redundant array 4 varies with whether the selector 7 selects the row repair or the column repair. A more detailed explanation of the structure and operation of the circuits of FIGS. 1 and 2 is provided in the '683 patent.

The conventional redundancy techniques described above afford an advantage of reduction in the speed performance penalty. One disadvantage is that the cell array is increased in size toward the row direction, thus, resulting in an increase in the area of the chip. Indeed, based on the implementation, as the redundant cell array increases in the row direction, additional bit line decoders and sense amplifiers S/A are needed, and the write driver W/D array and data line bus must be increased, thus requiring additional chip space.

SUMMARY OF THE INVENTION

Accordingly, it is an object of the present invention to provide a semiconductor memory device having redundancy without performance penalty during a redundancy operation, while minimizing the size of the redundancy array to minimize the chip size, as well as minimize current consumption during a redundancy operation.

In one aspect of the present invention, a semiconductor memory device comprises:

a default array block comprising a default array and sense amplifier;

a row redundant array block, independent of the default array, comprising row redundant arrays for compensating for a deficiency in a row direction;

a column redundant array block, independent of the default array, comprising column redundant arrays for compensating for deficiency in a column direction;

a controller for generating a first control signal that is commonly applied to the default array, row redundant array block, and column redundant array block; and a redundant calculation circuit, responsive to the first control signal and an address signal, for generating a second control signal to the row and column redundant array blocks and to determine whether a redundant array is accessed, and for generating a third control signal to disable the sense amplifier of the default array during a redundant array access.

In another aspect, the row redundant array block and the column redundant array block each comprise a sense amplifier, a word line driver, and a decoder.

In yet another aspect, the row redundant array block, the column redundant array block and the default array block share a common data line.

In another aspect of the invention, the semiconductor memory device further comprises a multiplexer, operatively connected to data lines of the row redundant array block, data lines of the column redundant array block and data lines of the default array block, to selectively output data from the row redundant array block, column redundant array block and the default array block.

In yet another aspect, the row redundant arrays are mapped so that column addresses of the default array become row addresses, and the column redundant arrays are mapped so that a portion of the row addresses of the default array become column addresses.

In another aspect of the present invention, a method is provided for managing a memory array in a semiconductor memory device, wherein the memory array comprises a default array and a redundant array of memory cells, wherein the method comprises the steps of:

mapping a row redundant array so that column addresses of the default array become row addresses;

accessing the row redundant array to compensate for a deficiency in a row direction of the default array;

mapping a column redundant array so that a portion of row addresses of the default array become column addresses;

accessing the column redundant array to compensate for a deficiency in a column direction of the default array; and disabling operation of a sense amplifier of the default array during an access of one of the row redundant array and column redundant array.

These and other objects, features and advantages of the invention will become more apparent from the following detailed description of preferred embodiments made with reference to the accompanying drawings.

DETAILED DESCRIPTION OF PREFERRED EMBODIMENTS

Figure 1:
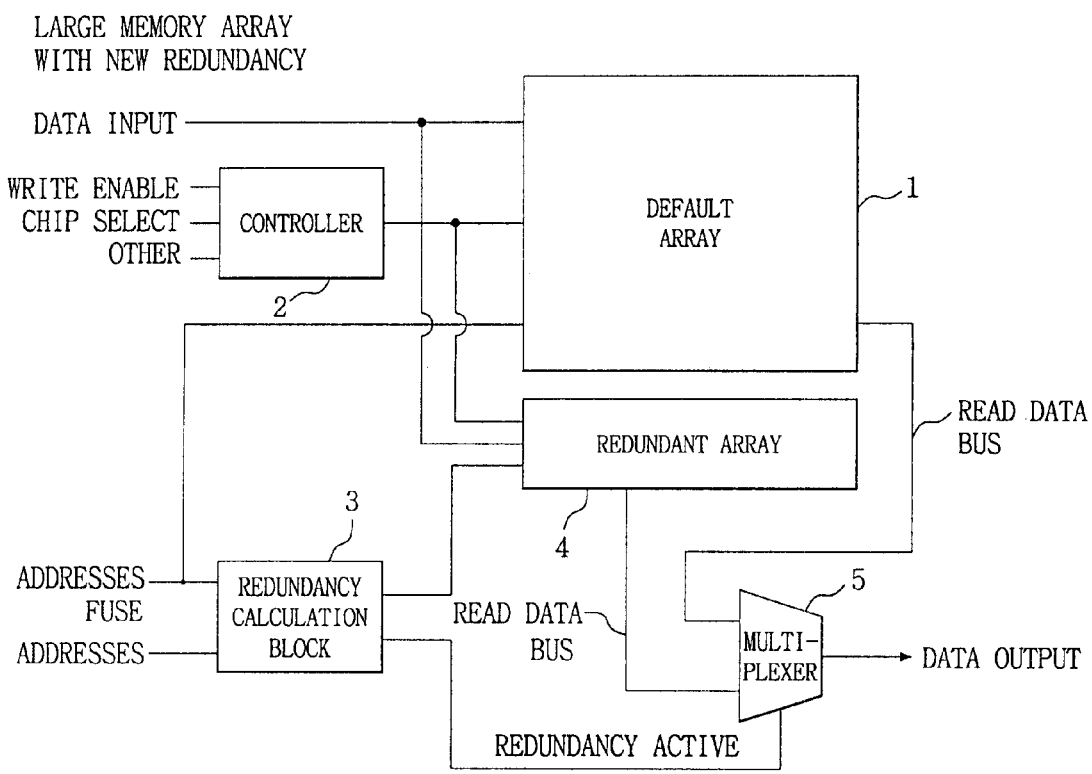
FIG. 1 is a block diagram of a memory array with redundancy according to the prior art.
Figure 2:
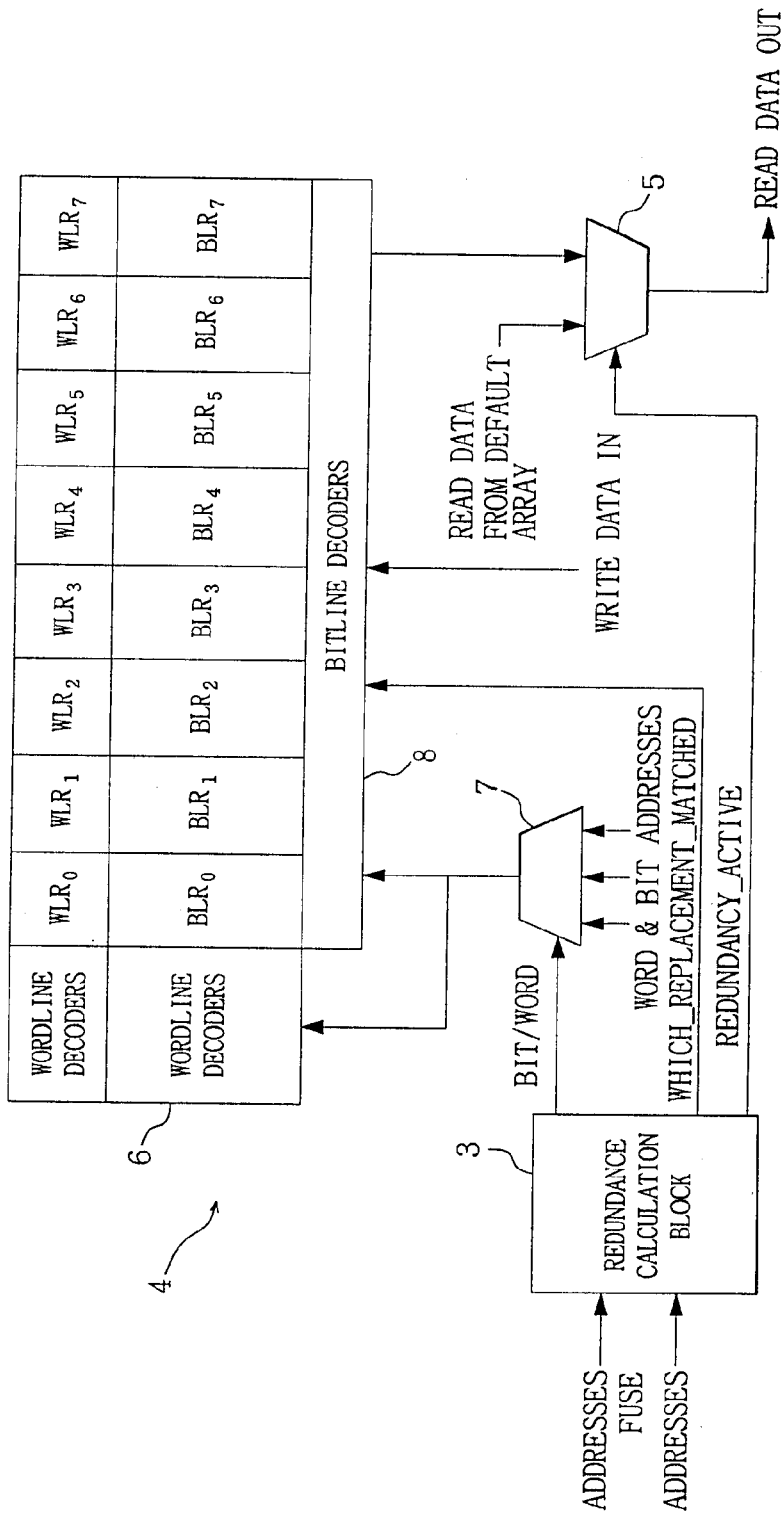
FIG. 2 is a block diagram of a redundancy circuit according to the prior art.

The present invention is directed to a semiconductor memory device having redundancy without performance penalty during a redundancy operation, while minimizing the size of the redundancy array to minimize the chip size and current consumption. In general, a semiconductor device according to an embodiment of the present invention comprises a row redundant array and column redundant array that are separated from a default array such that each of the arrays is an independent block. Advantageously, with such architecture, each block in row and column structures is mapped into new addresses, thereby allowing a flexible redundant array structure.

Furthermore, the present invention is directed to a method for managing a memory array having the above-structure, wherein a sense amplifier of the default array is disabled during a redundant array operation, thereby reducing current consumption.

Hereinafter, preferred embodiments of the present invention will be explained in detail with reference to the accompanying drawings. It is to be understood that elements depicted in the drawings that are similar (or provide similar functions) are denoted with the same reference numerals. Further, detailed explanations of structures and methods that are known to those skilled in the art have been omitted.

Figure 3:
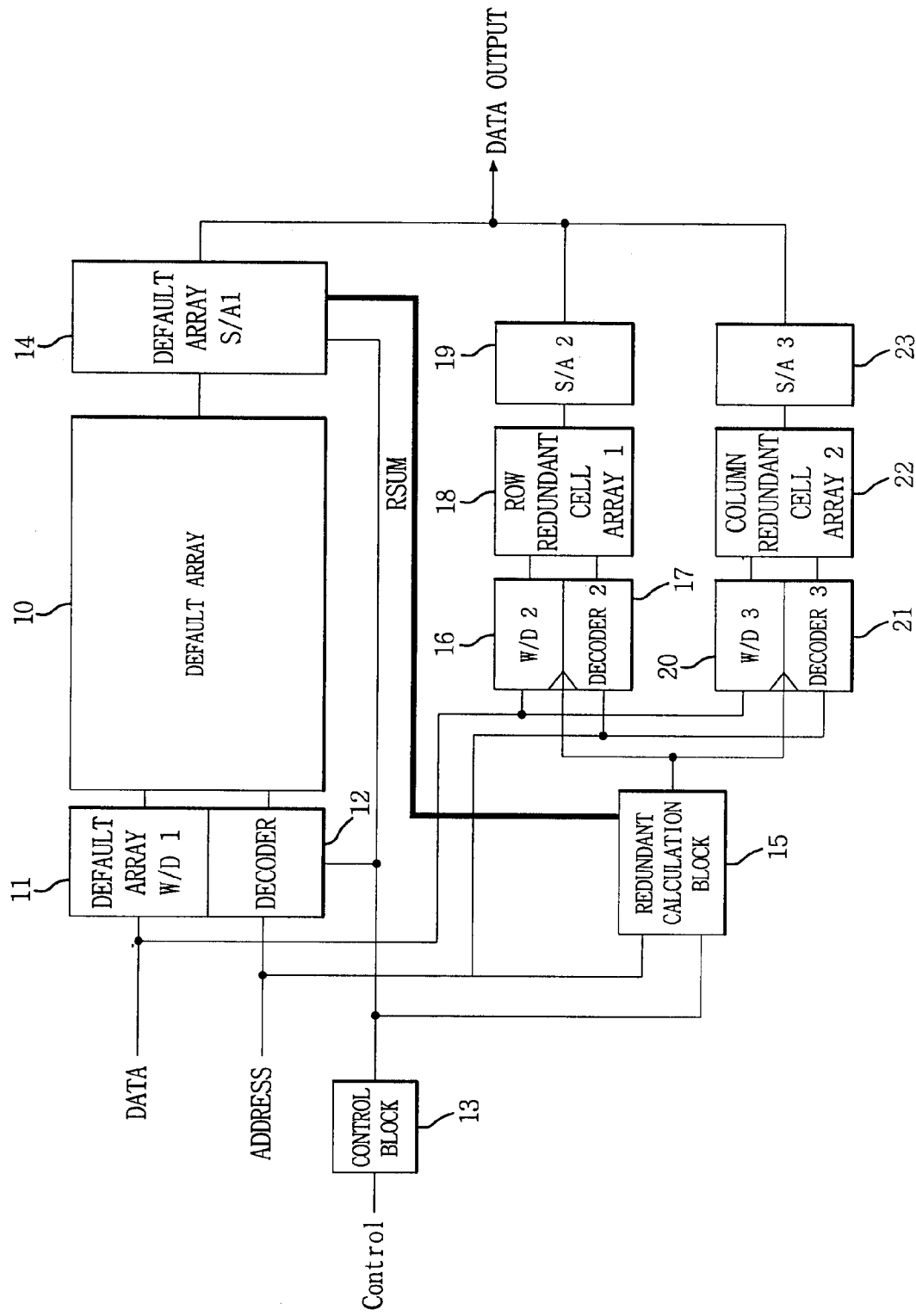
FIG. 3 is a block diagram of a memory array with redundancy according to an embodiment of the present invention.
Figure 5:
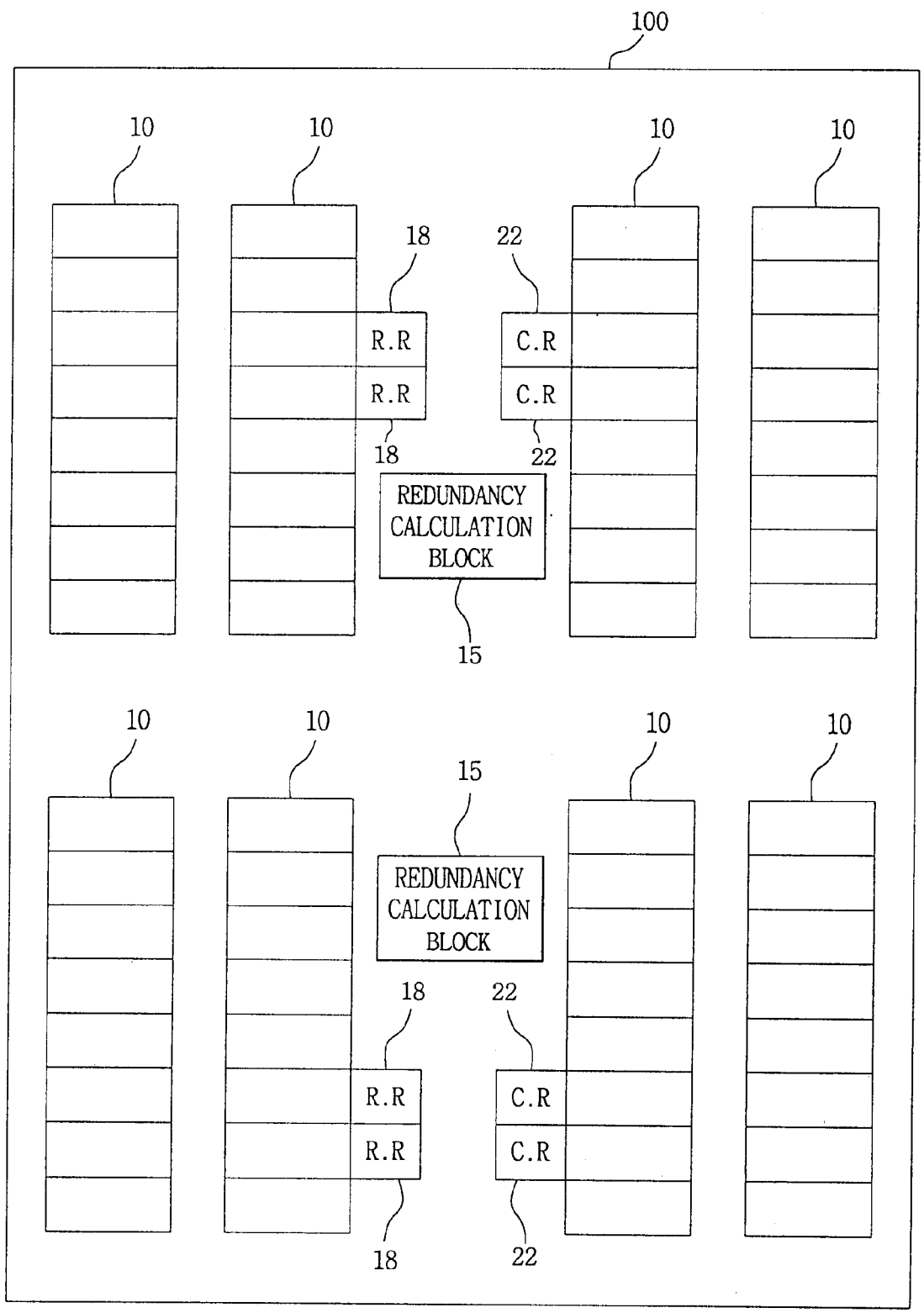
FIG. 5 is a schematic diagram illustrating a layout of a redundancy circuit in a semiconductor device according to an embodiment of the present invention.

FIG. 3 is a block diagram of a semiconductor memory device comprising a memory with redundancy according to an embodiment of the present invention. The memory device comprises a memory array comprising a default array 10 and a redundancy array that preferably comprises an independent row redundant cell array 18 and a column redundant cell array 22. In the exemplary embodiment, row direction corresponds to one block of the default array 10, and column direction corresponds to one block comprising a smaller amount of cells (e.g., on the order of 64 cells). Accordingly, the memory device according to the present invention only needs an amount of sense amplifiers S/A (e.g., S/A1 14, S/A2 19, S/A3 23), write drivers W/D (e.g., W/D1 11, W/D2 16, W/D3 20) and decoders (e.g., 12, 17 21) equal to the smaller amount of the row and column redundant arrays, thereby reducing the chip size area. This is shown in FIG. 5, which is an exemplary layout of a redundancy circuit in a semiconductor device according to the present invention. In particular, FIG. 5 illustrates the structure of a block 100 of 8M Sync. SRAM. The cell arrays corresponding to normal redundancy and other circuits are preferably integrated at a central portion of the chip block 100. Control circuit for a normal operation, address buffers, and pre-decoders are arranged at the center part in FIG. 5. In addition, row redundant array blocks (R.R) 18 and column redundant array blocks (C.R) 22 are shown arranged approximately about the center part of the chip block 100.

Referring again to FIG. 3, the memory device further comprises a control block 13 and redundant calculation block 15. The default array 10 and redundant arrays (18, 22) share a common data line. In particular, data lines connected to S/A1 14 of the default array 10, S/A2 19 of the row redundant array 18 and S/A3 23 of the column redundant array 22 are shared. During access of the redundant cell array, the S/A1 14 of the default array 10 is preferably disabled via a signal RSUM, which is generated by the redundancy calculation block 15. During a repair process, the S/A1 14 of the default array 10 can be disabled, thereby reducing current dissipation.

On the semiconductor memory device, the redundancy calculation block 15 is preferably disposed adjacent to the control block 13 which allows the S/A1 14 of the default array 10 to be disabled more quickly. The data lines according to the present invention can be designed by slightly extending the conventional data lines, thereby keeping the chip size area to a minimum.

Figure 4:
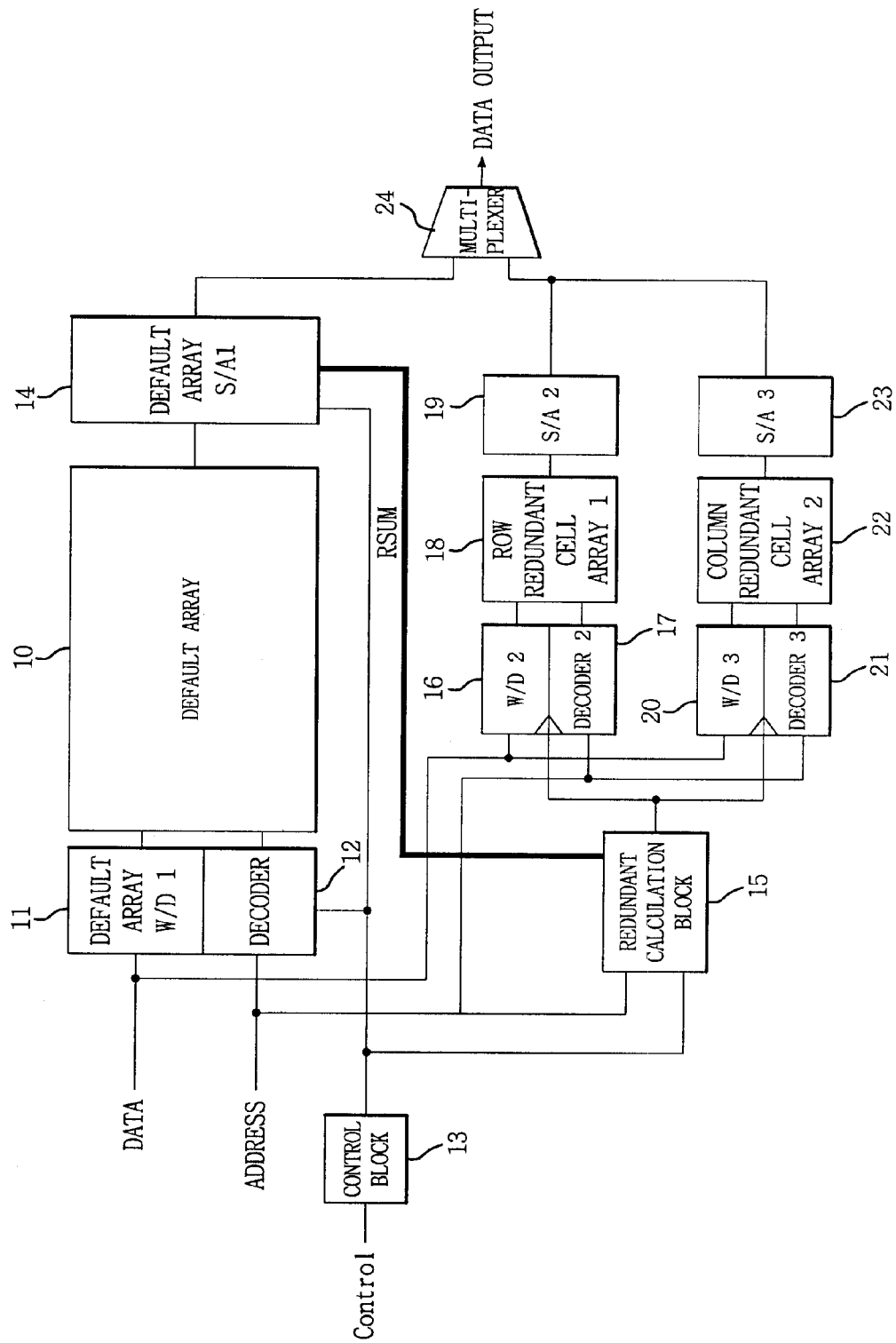
FIG. 4 is a block diagram of a memory array with redundancy according to another embodiment of the present invention.

FIG. 4 is a block diagram of a semiconductor memory device comprising a memory with redundancy according to another embodiment of the present invention. The circuit of FIG. 4 is similar to the circuit of FIG. 3 except that FIG. 4 comprises a multiplexer 34 operatively connected to the default array 10 and redundant arrays 18, 22. Furthermore, in the embodiment of FIG. 4, the data lines of the redundant arrays 18, 22 are separate from the data lines of the default array 10. The data lines are input to a multiplexer 24 which selectively outputs data received from the redundant arrays and default array (whereas in FIG. 3 the row redundant array, column redundant array and default array are connected to each other with a common data line). In FIG. 4, the redundant array 18, 22 and the default array 10 utilize the same amount of the data lines to the multiplexer 24.

If chip pads are placed at edges of the semiconductor chip thereby having the multiplexer 24 terminals dispersed in all directions, serious problem can occur. When the data lines are shared in the structure, however, such as in the present invention, and the data output can be controlled by the multiplexer 24 as described in the conventional scheme regardless if the signal RSUM is delayed and it is difficult to disable the S/A1 14 of the default array 10, or the busing of the extended data line is not burdened. With the embodiment of FIG. 4, it is to be appreciated that current consumption can be reduced by generating the RSUM signal to disable operation of the S/A1 14 of the default array 10 during a repair operation as in FIG. 3.

The operation and related structure of the semiconductor memory device with redundancy will be further explained with reference to FIGS. 3 and 4. In the following explanation, the terms row redundant cell array block and row redundant array block have the same meaning. Further, the terms row redundant cell array and row redundant array have the same meaning. Moreover, "column" is applied in the same manner.

The row redundant cell array block 18 is independently separated from the default array 10 in its structure and comprises row redundant arrays for compensating for a deficiency of the row direction. Likewise, the column redundant cell array block 22 is independently separated from the default array 10 in its structure and comprises row redundant arrays for compensating for a deficiency of the column direction. The controller 13 outputs a common control signal being applied to each of the default array 10, row redundant array 18, and column redundant array 22. The redundancy calculation circuit 15 receives a control signal from the controller 13 and an address signal. In response, the redundancy calculation circuit 15 generates a control signal for determining whether the redundant arrays 18 and 22 are accessed and necessary. The redundancy calculation circuit 15 also generates control signal RSUM to disable the sense amplifier 14 of the default array 10 during the access of the redundant arrays 18 and 22. Again, the row redundant array block 18 and column redundant array block 22 are each provided with a sense amplifier, word line driver, and decoder.

It is to be appreciated that any special mapping method may be implemented for the aforementioned redundancy scheme. A preferred mapping method of the present invention is as follows.

Figure 6:
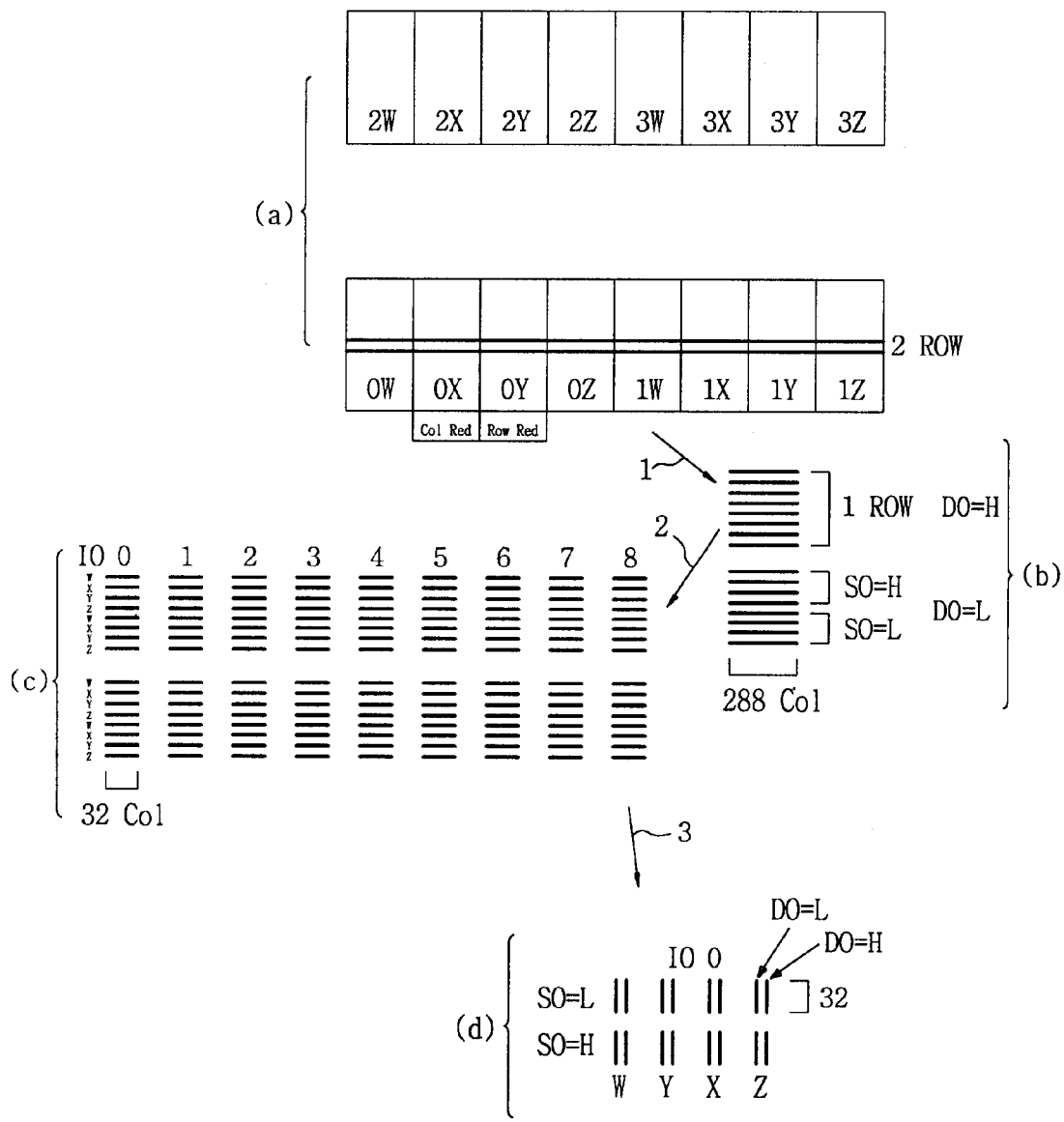
FIG. 6 is an exemplary diagram illustrating a method for matching a row repair block in which redundancy circuit is applied according to the present invention.
Figure 7:
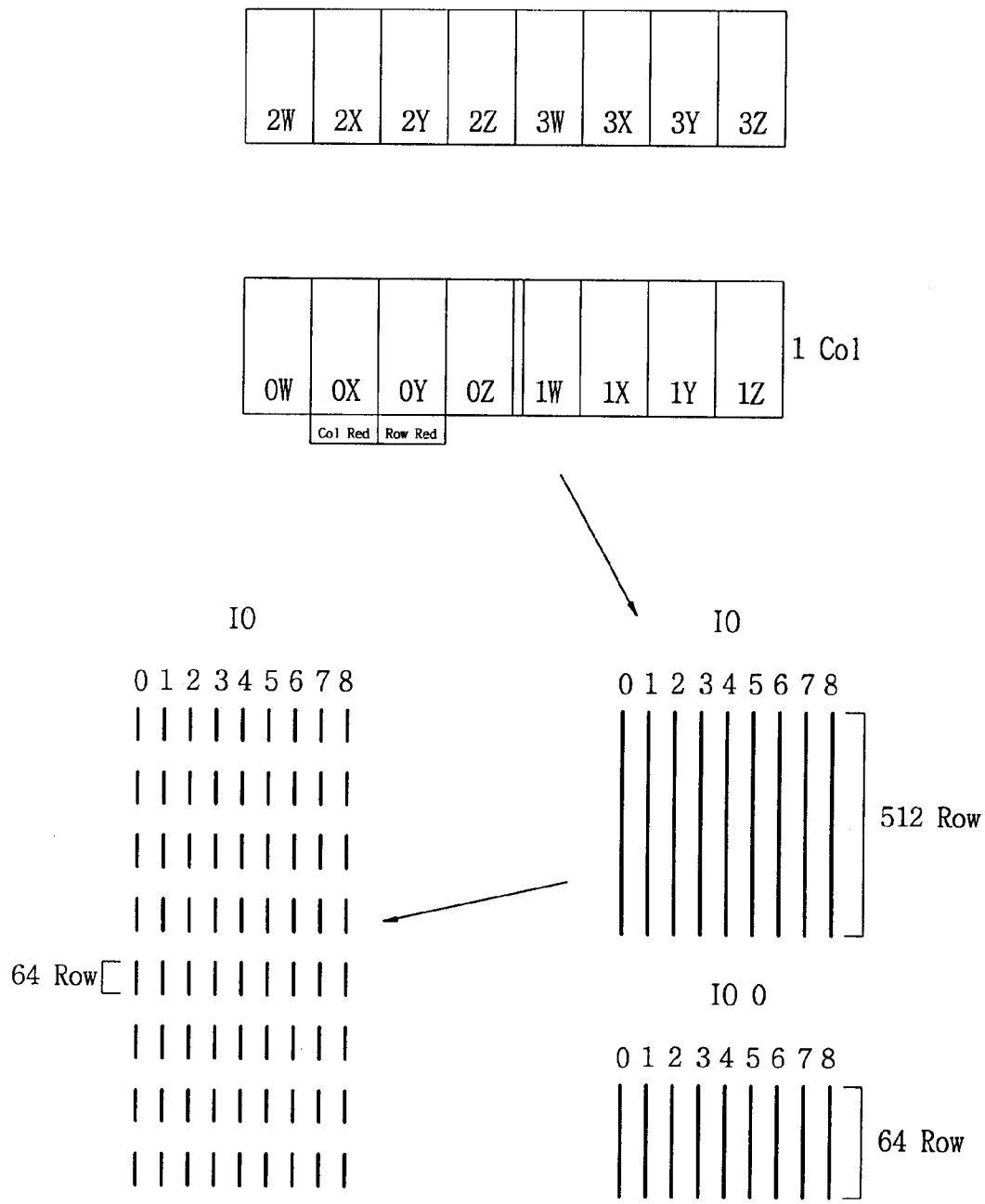
FIG. 7 is an exemplary diagram illustrating a method for matching a column repair block in which redundancy circuit is applied according to the present invention.

In general, the row redundant array 18 is mapped so that column addresses of the default array 10 become row addresses, and the column redundant array 22 is mapped so that some of the row addresses become a column address. FIGS. 6 and 7 are diagrams illustrating exemplary mapping methods according to the invention. FIG. 6 is a diagram of an exemplary mapping of a row repair block in which a redundancy circuit is applied and FIG. 7 is a diagram of an exemplary mapping of a column repair block in which a redundancy circuit is applied.

More specifically, FIG. 6 is an exemplary diagram illustrating a mapping of row repair block (row redundancy cell mapping). Prior to explaining the row redundancy cell mapping, the structure of normal cell block should be understood. FIG. 6 indicates a redundancy scheme in one "mat". One "mat" comprises 8 normal cell blocks, each of which has 9 I/Os therein. That is, one cell block comprises nine I/Os, each of which has 32 columns, and a pair of BL/BLB includes 512 cells. That is, 512 WLs (wordlines) or ROWs exist. Accordingly, the total number of columns in one block is 32*9=288.

In a row redundancy scheme according to the present invention, one repair unit preferably comprises two rows, which means that even if one cell fails or one row fails, two rows can be replaced. Such function may vary with the relationship between the quantity of redundancy cells and fuse boxes determining the redundancy. If a WL in one block is referred to as SWL, since one mat is formed of 8 blocks, as described above, one row is formed of 8 SWLs. Therefore, two ROWs comprise 16 SWLs. If the 16 SWLs are stacked in order, the result is formed as indicated by the arrow 1 in FIG. 6. In the decoding system, if MSB selecting rows is addresses denoted D0W, the lower row indicates D0=L, and the upper indicates D0=H, thus, the row of D0=L is formed of 8 SWLs and the row of D0=H is formed of 8 SWLs.

Regarding S0, as shown in FIG. 6(a), the 16 blocks are formed of 0W, 0X, 0Y, 0Z, 1W, 1X, 1Y, 1Z, 2W, 2X, 2Y, 2Z, 3W, 3X, 3Y, and 3Z. The addresses determining the front number of 0, 1, 2, 3 correspond to S0, S1. Since the "S0" is LSB, the blocks corresponding to S0=L are 0W, 0X, 0Y, 0Z, 2W, 2X, 2Y, 2Z, and the parts of S0=H correspond to 1W, 1X, 1Y, 1Z, 3W, 3X, 3Y, 3Z. Therefore, one row includes 4 SWLs that correspond to S0=L, wherein the parts of S0=L include 4 SWLs that correspond to half the rows of D0=L and 4 SWLs that correspond to half the row of D0=H.

FIG. 6(c) shows an arrangement of the row shown in FIG. 6(b), that is, the drawing shows that one SWL is divided into several I/Os. As stated above, one SWL can be divided into 9 I/Os and one I/O includes 32 cells. FIG. 6(d) illustrates a portion corresponding to one I/O. A portion corresponding to one I/O comprises 16 lines having a length as much as 32 cells, as shown in FIG. 6(c). If the lines are rotated in a 90-degree arc, the lines can be rearranged as shown in FIG. 6(d). The rearranged cells have W, X, Y, Z that were included in the block address and D0 that was included in the row address, as block addresses. And, the rearranged cells have S0 out of the block address and 5 column addresses identifying 32 columns in the normal block, as row addresses. That is, a part of the existing column addresses and the block addresses become row addresses, and one of the existing row addresses, a part of the block addresses and the result of the redundancy fuse box become column addresses, respectively.

As described above, FIG. 6 shows the process of change in the repair unit. Since one repair unit is formed so as to comprise 8 columns in one I/O, one mat has 32 columns when 4 repairs are allowed in one mat. As a result, one mat is formed to have the same width as the normal block. It is to be understood that the amount of one repair unit and the number of repairs that is available in one mat may be modified based on chip density and the failure in the chip. Indeed, FIG. 6 is an exemplary embodiment in which one repair unit can replace two rows and one mat can replace 4 row repair units, and accordingly, up to the maximum 8 rows.

FIG. 7 is a diagram of an exemplary method for column address mapping according to the present invention. Replacing one column is the same as replacing 9 columns because all 9 I/Os should be replaced. One column comprises 512 cells, which can be divided into 64 cells by 8. As shown in FIG. 7, since the redundancy cell block is formed of 64 rows, rearranging 8 lines per one I/O results in 8 columns having 64 cells per one I/O. The result is that as many addresses of higher level out of the 9 row addresses that are decoding 512 rows in the normal block, are changed to column addresses. Since 8 columns for every one column of redundancy are created, one mat comprises 4 repairable columns if one I/O has 32 columns, like the row redundancy cell block. That is, according to the above row redundancy and column redundancy structure, a redundancy scheme can be formed in such a manner that one mat comprises 4 row redundancies and 4 column redundancies.

It should be noted that one row redundancy could repair two rows. If 8 row redundancy fuse boxes are provided and one row redundancy repairs only one row, a redundancy scheme can be formed in such a manner that one mat has 8 row redundancies and 4 column redundancies.

As described in the foregoing, according to the present invention, the row redundant array and column redundant array are each fabricated as independent blocks and the sense amplifiers of the default arrays are disabled, thereby preventing speed penalty during redundancy operation, reducing chip size in redundancy cell arrays, and reducing current consumption.

Although illustrative embodiments have been described herein with reference to the accompanying drawings, it is to be understood that the present invention is not limited to those precise embodiments, and that various other changes and modifications may be affected therein by one skilled in the art without departing from the scope and spirit of the invention. It is to be understood that all such changes and modifications are intended to be included within the scope of the invention as defined by the appended claims.

What is claimed is:

1. A semiconductor memory device, comprising:
   a default array block comprising a default array and sense amplifier;
   a row redundant array block, independent of the default array, comprising row redundant arrays for compensating for a deficiency in a row direction;
   a column redundant array block, independent of the default array, comprising column redundant arrays for compensating for deficiency in a column direction;
   a controller for generating a first control signal that is commonly applied to the default array, row redundant array block, and column redundant array block; and
   a redundant calculation circuit, responsive to the first control signal and an address signal, for generating a second control signal to the row and column redundant array blocks and to determine whether a redundant array is accessed, and for generating a third control signal to disable the sense amplifier of the default array during a redundant array access.

2. The semiconductor memory device of claim 1, wherein the row redundant array block and the column redundant array block each comprise a sense amplifier, a word line driver, and a decoder.

3. The semiconductor memory device of claim 1, wherein the row redundant array block, the column redundant array block and the default array block share a common data line.

4. The semiconductor memory device of claim 1, further comprising a multiplexer, operatively connected to data lines of the row redundant array block, data lines of the column redundant array block and data lines of the default array block, to selectively output signals from the row redundant array block, column redundant array block and the default array block.

5. The semiconductor memory device of claim 1, wherein the row redundant arrays are mapped so that column addresses of the default array become row addresses, and the column redundant arrays are mapped so that a portion of the row addresses of the default array become column addresses.

6. A semiconductor memory device, comprising:
   a default array;
   a row redundant array block comprising row redundant arrays that are independent from the default array, for supplementing a deficiency in a row direction, wherein the row redundant array block is mapped so that the column addresses of the default array become row addresses; and
   a column redundant array block comprising column redundant arrays that are independent from the default array, for supplementing a deficiency in a column direction, wherein the column redundant array block is mapped so that a portion of the row addresses of the default array become column addresses.

7. The semiconductor memory device of claim 6, further comprising a redundancy calculation circuit for generating a control signal to disable a sense amplifier of the default array during a redundant array access.

8. The semiconductor memory device of 6, wherein the row redundant array block and the column redundant array block each comprise a sense amplifier, a word line driver, and a decoder.

9. The semiconductor memory device of claim 6, wherein the row redundant array block, the column redundant array block and the default array share a common data line.

10. The semiconductor memory device of claim 6, further comprising a multiplexer, operatively connected to data lines of row redundant array block, data lines of the column redundant array block and data lines of the default array, to selectively output signals from the row redundant array block, column redundant array block and the default array.

11. A method for managing a memory array in a semiconductor memory device, wherein the memory array comprises a default array and a redundant array of memory cells, the method comprising the steps of:
    mapping a row redundant array so that column addresses of the default array become row addresses;
    accessing the row redundant array to compensate for a deficiency in a row direction of the default array;
    mapping a column redundant array so that a portion of row addresses of the default array become column addresses;
    accessing the column redundant array to compensate for a deficiency in a column direction of the default array; and
    disabling operation of a sense amplifier of the default array during an access of one of the row redundant array and column redundant array.

12. The method of claim 11, further comprising the step of outputting data from the row redundant array, column redundant array and default array to a common data line.

13. A program storage device readable by a machine, tangibly embodying a program of instructions executable by the machine to perform method steps for managing a memory array in a semiconductor memory device, wherein the memory array comprises a default array and a redundant array of memory cells, the method steps comprising:
    mapping a row redundant array so that column addresses of the default array become row addresses;
    accessing the row redundant array to compensate for a deficiency in a row direction of the default array;
    mapping a column redundant array so that a portion of row addresses of the default array become column addresses;
    accessing the column redundant array to compensate for a deficiency in a column direction of the default array; and
    disabling operation of a sense amplifier of the default array during an access of one of the row redundant array and column redundant array.

* * * * *